United States Patent [19]
Kannan et al.

[11] Patent Number: 5,756,157
[45] Date of Patent: May 26, 1998

[54] METHOD FOR PROCESSING FLAT PANEL DISPLAYS AND LARGE WAFERS

[75] Inventors: Chak D. Kannan, Fremont; Adam Jerome Weber, San Jose, both of Calif.

[73] Assignee: Silicon Valley Group, San Jose, Calif.

[21] Appl. No.: 725,282

[22] Filed: Oct. 2, 1996

[51] Int. Cl.$^6$ ................................................ B05D 3/02
[52] U.S. Cl. ........................ 427/374.1; 427/398.3; 427/444
[58] Field of Search .................... 427/314, 374.1, 427/398.3, 444

[56] References Cited

PUBLICATIONS

U.S. Display Consortium Development Agreement effective Jul. 12, 1994; Contract No. RFP 93-4.

*Primary Examiner*—Bernard Pianalto
*Attorney, Agent, or Firm*—Wilson Sonsini Goodrich & Rosati; Robert Moll

[57] ABSTRACT

The invention provides a hot plate oven and a method suitable to bake materials on substrates such as flat panel displays and large semiconductor wafers such as 300 mm in diameter and above. The hot plate oven in one embodiment includes an insulated chamber, a heater in the chamber, a door for entry of a substrate, a frame, preferably water cooled, for suspending the substrate above the heater, a substrate lowering mechanism to hold the frame and lower the substrate to a certain height above the heater, and a set of manifolds and valves to feed and exhaust gases, vapors, and apply a vacuum to the chamber. In another feature, the oven assembly includes a stack of low profile ovens, each having a door on the side for entry of a substrate.

1 Claim, 7 Drawing Sheets

METHOD FOR PROCESSING FLAT PANEL DISPLAYS AND LARGE WAFERS

BACKGROUND

The present invention relates to flat panel display and semiconductor manufacturing equipment, and particularly to a hot plate oven and a method for baking materials on substrates such as flat panel displays and semiconductor wafers.

Flat panel displays and wafers are baked by placing them in a hot plate oven. Typically, the hot plate oven includes a heated chuck that has a set of three to four proximity pins protruding from the heated chuck to hold the substrate above the heated chuck. Some hot plate ovens have large top doors that expose the substrate to considerable ambient air when the substrate is placed in the oven. In a typical oven used to bake substrates, the thermal environment will be greatly disturbed when the large top door is opened. Thus, after introduction of the substrate in the oven there will be undesirable lag time to achieve thermal equilibrium which slows production. Further, when the large top door opens contamination in the ambient air may be introduced. In addition, when hot plate ovens having large top doors are stacked upon each other they will need large vertical clearance space between each oven to permit placing the wafers through the top of the oven, which in turn leads to a need for large vertical robot travel requirements which raises the total cost of the processing equipment.

Hot plate ovens have used a set of three to four lift pins to lift the substrate off the heater surface to enable robotic handling systems to transfer substrates in and out of the oven. The lift pins do not, however, fully support the substrate in the center which then sags due to substrate's own weight and a high oven temperature. This is a particularly difficult problem for flat panel displays and large size wafers such as 300 mm diameter silicon wafers and for substrates having a high coefficient of thermal expansion. Further, the lift pins become hot in the oven over time and tend to leave an image on the top of the substrate opposite the contact point of the lift pin on the bottom of the substrate due to the volatility of the solvents used in some of the chemicals (e.g., blue color filter material and polyimides) contained in the coating material. Beyond any appearance related concerns the images indicate the physical characteristic of the substrate have changed in some indeterminate way at and about the image which makes the substrate unacceptable for further processing.

SUMMARY OF THE INVENTION

The present invention provides an oven and a method for baking materials on substrates. In one embodiment, the oven includes an insulated chamber, a heater in the chamber, a door for entry of a substrate, a frame, preferably water cooled, for suspending the substrate above the heater, a substrate lowering mechanism to hold the frame and lower the substrate to a certain height above the heater, and a set of manifolds and valves to feed and exhaust gases, vapors, and apply a vacuum to the chamber. A temperature control system controls the set point temperature of the heater and cuts off power to the heater to protect the heater if the heater temperature goes beyond a certain limit.

In another feature of the invention, the oven assembly includes a stack of low profile ovens, each having a door on the side for entry of a substrate. Much less vertical space is needed between the stacked ovens because the wafers enter the chambers through the side doors rather than through top of the ovens. This feature of the invention reduces the amount of vertical travel needed by the robot transporting substrates in and out of the oven. Because the oven chamber is preferably sealed and the door opening is minimized and conforms to the substrate geometry, the oven environment, thermally and chemically, can be easily and closely controlled during introduction of the substrates, and better process results are obtained.

DETAILED DESCRIPTION OF THE PREFERRED EMBODIMENTS

The following description includes the best mode of carrying out the invention. This detailed description is made for the purpose of illustrating the general principles of the invention and should not be taken in a limiting sense. The scope of the invention is best determined by reference to the claims.

The invention provides a hot plate oven and a method suitable to bake materials on substrates such as flat panel displays and large semiconductor wafers such as 300 mm in diameter and above. In a typical application, baking is done in a hot plate oven after coating the substrate with chemicals such as photoresist (resist) to dry out any solvents and form one or more uniform layers of the material on the top of the substrate.

In an another application, the hot plate oven can be used in conjunction with a vapor prime process such as those used in the semiconductor industry. For instance, one vapor prime process might use a priming agent such as hexamethyldisilane (HMDS) maintained in a liquid phase in a canister. When HMDS is added into the oven chamber, nitrogen gas at 5 psig or less is bubbled through the liquid HMDS, and the saturated vapor introduced into the oven chamber for less than a few minutes under a vacuum such as 15 inches of Hg. Introduction of the saturated vapor of nitrogen and HMDS is then stopped and pure nitrogen is supplied to purge the oven chamber while the chamber is exhausted. The vapor prime process is believed to provide better adhesion properties between the substrate and resists. During the vapor prime process the oven is maintained at about 150–180 degrees C.

Figure 1:
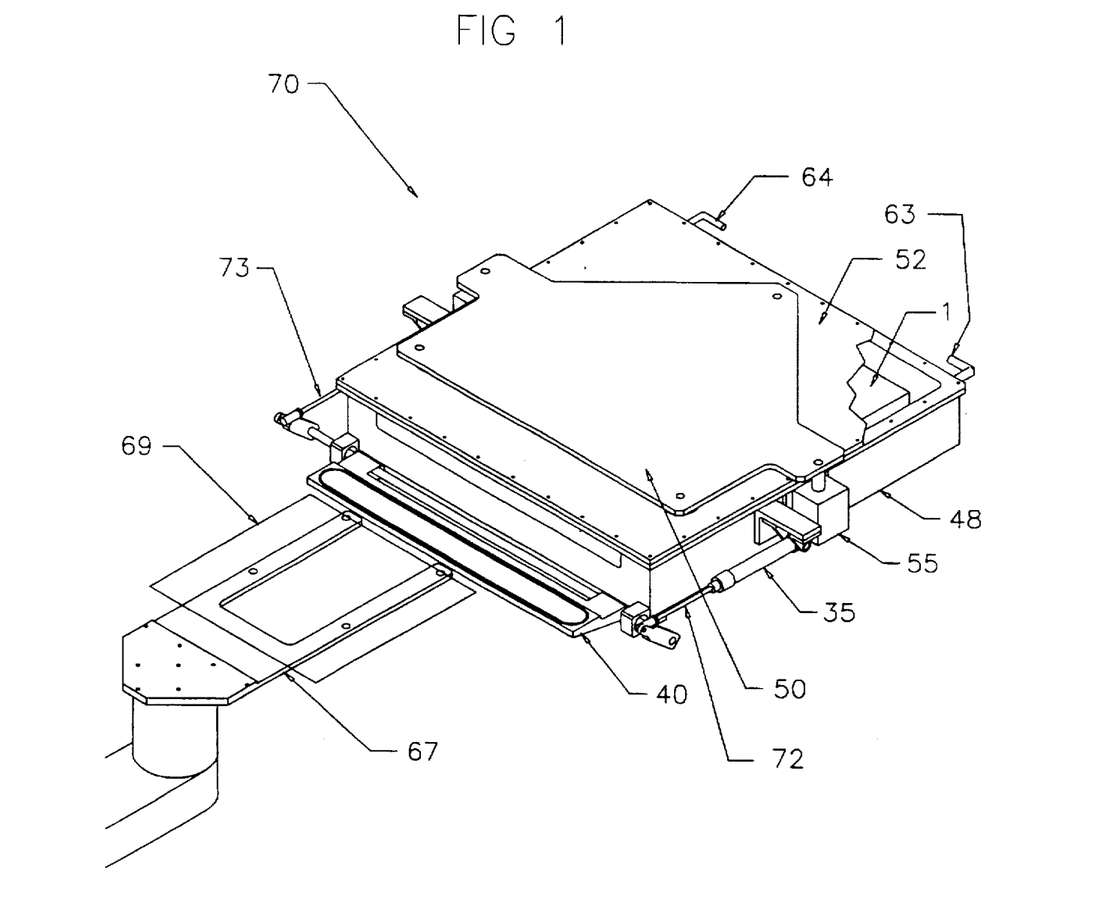
FIG. 1 is an isometric view of the assembled hot plate oven, including a door in the open position for insertion of a substrate into the oven chamber by a wafer handler such as a robotic arm end effector.

FIG. 1 is an isometric view of the assembled hot plate oven 70. The hot plate oven 70 includes a door 40, shown in the open position, for entry of a wafer handler such as robotic arm end effector 67 to bring a substrate 69 into a oven chamber defined by a chamber housing 48 and housing cover 52 where the material on substrate 69 is baked. The door 40 is opened and closed by movement of piston rods 72 and 73 within cylinders 35 and 44 (FIG. 3A), respectively. As shown in FIG. 1, the hot plate oven 70 includes a heater block 1 in the chamber housing 48 providing heat to the substrate 69. A substrate raising plate 50 can be raised and lowered vertically upon demand by cylinders 55 and 49 (FIG. 3A) which in turn raise and lower a display holding frame 29 (FIG. 3B) which suspends the substrate 69 in the chamber housing 48 above the heater block 1 and below the housing cover 52. Two manifolds 63 and 64 are in fluid communication with the chamber housing 48 through the back of the oven 70 and supply and/or exhaust gas to the chamber housing 48, or even pull a vacuum from the chamber housing 48 depending on the given process requirements.

Figure 2A:
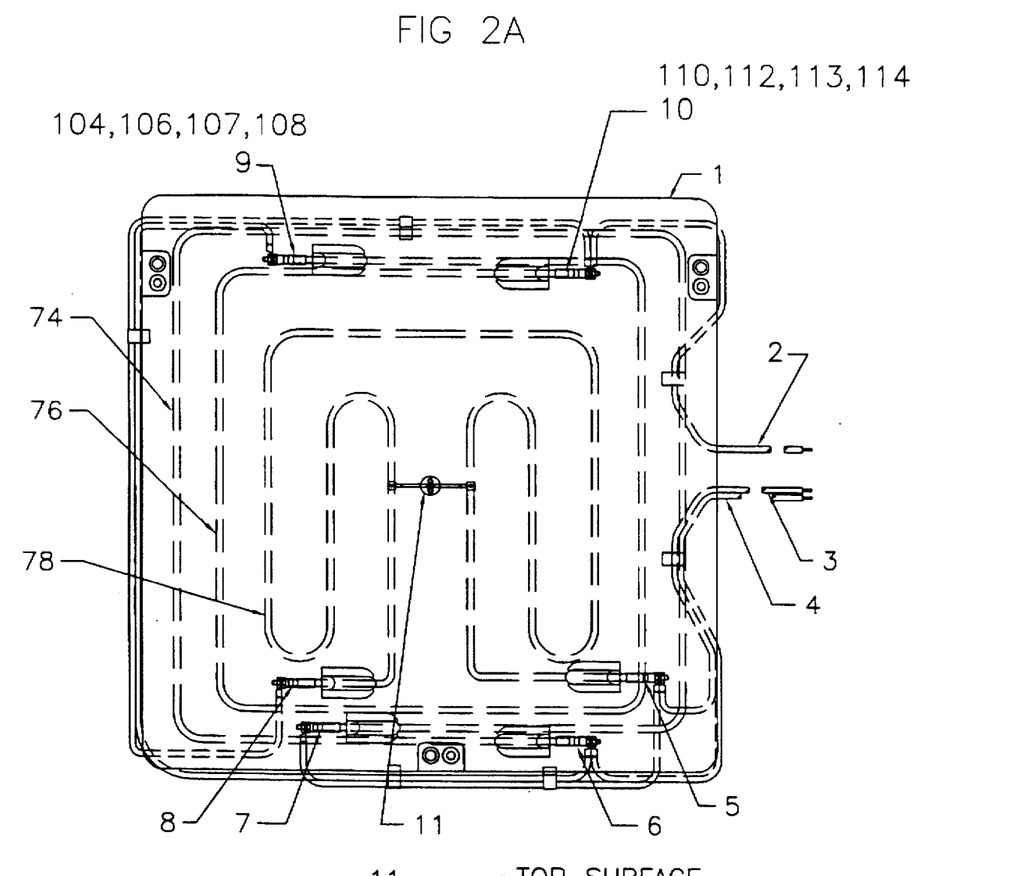
FIG. 2A is a bottom view of the heater block illustrating the layout of the heating elements with terminations and the central pin.

FIG. 2A is a bottom view of the hot plate oven with emphasis on the heater block and layout of the heating elements with their terminations and a central pin. As shown in FIG. 2A, the heater block 1 includes a first heating element 74, a second heating element 76, and a third heating element 78 which are resistive heating elements which make contact with the heater block 1 and are disposed in a snake like pattern. The heater block 1 can be made of a suitable conductor such as aluminum. The first heating element 74 includes terminations 6 and 7, the second heating element 76 includes terminations 9 and 10, and the third heating element 78 terminations 5 and 8. A first power supply wire 2 connects to termination 10 of the second heating element 74 and termination 6 of the third heating element 78. A second power supply wire 3 connects to termination 5 of the third heating element 78 and termination 6 of the first heating element 74. A third power supply wire 4 connects to termination 6 and 7 of the first heating element 74. Power is supplied to the power supply wires 2, 3, and 4 from 208 V three phase AC source. The heating elements 74, 76, and 78 and the wires 2, 3, and 4 are insulated where they are exposed and non-insulated in the heater block 1. A central pin 11 is disposed in a central region of the heater block 1 and is held in place by screws into the heater block 1. In an alternative embodiment, the central pin 11 may include more than one central pin, and need not be restricted to being disposed at the center of the heater block 1. The central pin 11 only needs to be disposed in the heater block 1 so as to function to counteract any sag of the substrate 69 during the baking process.

Figure 2B:
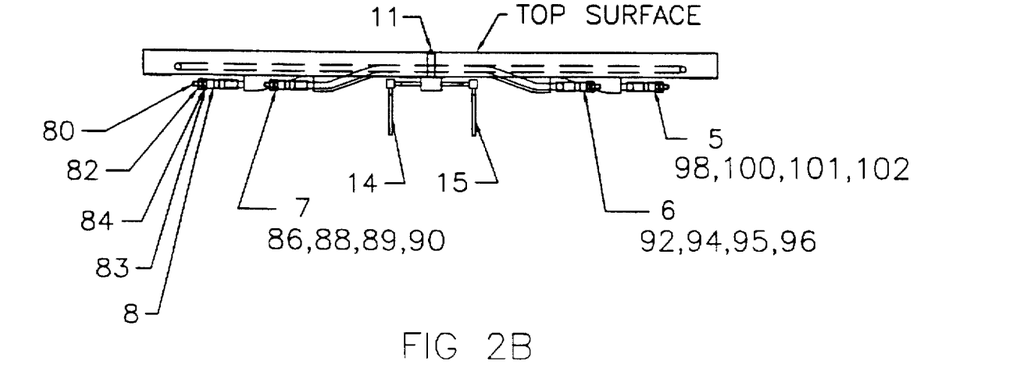
FIG. 2B is a side view of the heater block illustrating the terminations of the heating elements and the central pin with its cooling tubes.

FIG. 2B is a side view of the heater block 1 illustrating the terminations 5, 6, 7, and 8 of the heating elements and the central pin 11 with its cooling tubes 14 and 15. Termination 8 includes a heating element 78 (FIG. 2A) which ends in a threaded post 80. Nuts 82 and 83 secure the power supply wire lug 84 to the heating element 78. The other terminations 5, 6, and 7 shown in FIG. 2B and terminations 9 and 10 shown in FIG. 2A are of similar construction to termination 8, and lie parallel to the plane of the heater block 1. As a result, the hot plate oven 70 is a low profile oven capable of being stacked in a multiple oven assembly.

A cooling fluid such as water is supplied to the cooling tubes 14 and 15 of the central pin 11 to carry heat from the central pin 11 to maintain the central pin 11 at a lower temperature than the heater block 1. The central pin 11 prevents sagging in the center of the substrate 69 (e.g., flat panel display and the larger wafers) due to thermal expansion during the baking process, prevents an image from appearing on the top of the substrate 69 opposite the contact point of the pin 11, and protects the integrity of the physical characteristics of the coated substrate 69.

Figure 3A:
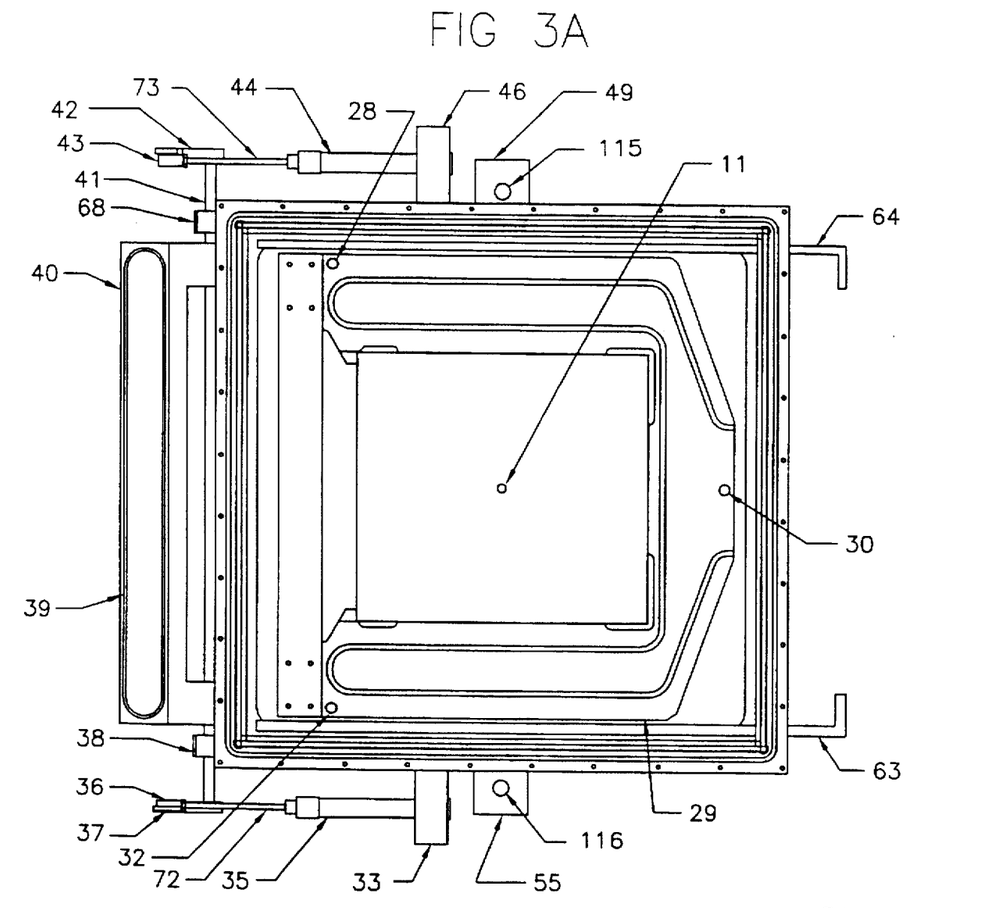
FIG. 3A is a top view of the hot plate oven illustrating the door assembly and the display holding frame.
Figure 3B:
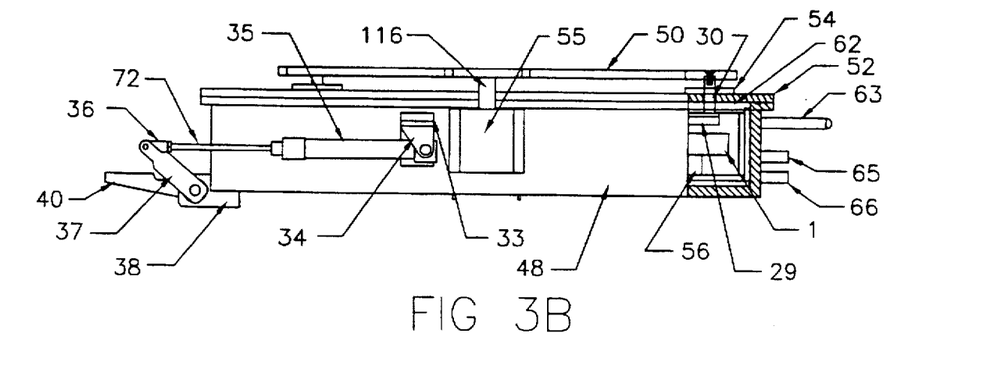
FIG. 3B is a side view of the hot plate oven illustrating the door assembly, the substrate raising plate, the display holding frame, the heater block, and the chamber housing.

FIG. 3A is a top view of the hot plate oven 70 illustrating the door assembly and the display holding frame 29. To illustrate these features the hot plate oven 70 is shown without the housing cover 52 (FIG. 3B) in place, without the substrate raising plate 50 (FIG. 3B), and with the door 40 in the open position. The door assembly includes a door 40 of preferably aluminum having a door seal 39 preferably of a silicone O-ring. The door 40 is attached to a shaft 41 held in place by bearings 38 and 68 on the ends of the shaft 41. The shaft 41 is connected to lever 37 and lever 42 at each of its ends, which are connected to clevis 36 and 43 which are at the end of the piston rods 72 and 73. The piston rods 72 and 73 slide within cylinder 35 and 44 which are mounted at pivots 34 (FIG. 3B) and pivot 45 (FIG. 5) to brackets 33 and 46 extending to chamber housing 48 (FIG. 3B). As a result, the hot plate oven 70 is a low profile oven capable of being stacked in a multiple oven assembly. The display holding frame 29 with its associated spacer rods 28, 30, and 32, the cylinders 49 and 55 along with the piston rods 115 and 116 and the central pin 11 in the heater block 1 (FIG. 3B) are shown which actuate the raising and lowering of the display holding frame within the hot plate oven. The manifolds 63 and 64 extending from the backside of the chamber housing 48 are also shown.

Figure 4A:
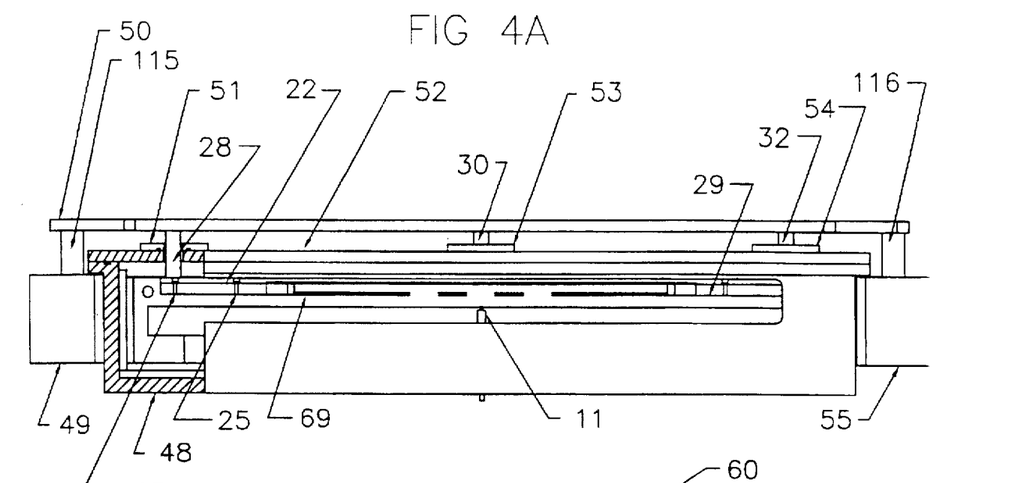
FIG. 4A is a front view of the hot plate oven with the door assembly removed. A partial cutaway on the left of the drawing illustrates the arrangement of the heater block, the central pin, the display holding frame with a substrate on the frame, the insulation, the housing cover, the spacer rod, and the substrate raising plate.

FIG. 3B is a side view of the hot plate oven 70 illustrating the door assembly, the substrate raising plate 50, the display holding frame 29, the heater block 1, and the chamber housing 48. To illustrate these features the hot plate oven 70 is shown with the housing cover 52 and substrate raising plate 50 in place and with the door 40 in the open position. The details of the door assembly and the manifold 63 are discussed above in connection with FIG. 3A. FIG. 3B is a partial cutaway at the back of the chamber housing 48 to illustrate the arrangement of the heater support 56, the heater block 1, the display holding frame 29 above the heater block 1, the insulation 62 lining the chamber housing 48, the housing cover 52, the spacer rod 30, and the substrate raising plate 50. As shown in FIG. 3B, the display holding frame 29 is attached to spacer rods 28, 30, and 32 which are attached at the other end to the substrate raising plate 50. The spacer rods 28, 30, and 32 enter the housing chamber through the seal plates 51, 53, and 54 as shown in FIG. 4A. The display holding frame 29 moves up and down when the piston rods 115 and 116 move vertically in their cylinders 49 and 55 as shown in FIG. 3A. The resistance temperature devices 65 and 66 enter the housing chamber 48 through the backside of the hot plate oven 70 and monitor the temperature in the heater block 1.

FIG. 4A is a front view of the hot plate oven 70 with the door assembly removed. A partial cutaway on the left of the drawing illustrates the arrangement of the heater block 1, the central pin 11, the display holding frame 29 with a substrate 69 on the display holding frame 29, housing cover 52, the spacer rods 28, 30, and 32, the seal plates 51, 53, and 54, and a substrate raising plate 50. The display holding frame 29 includes a stiffener plate 29 which is attached with screws 25 and 27.

Figure 4B:
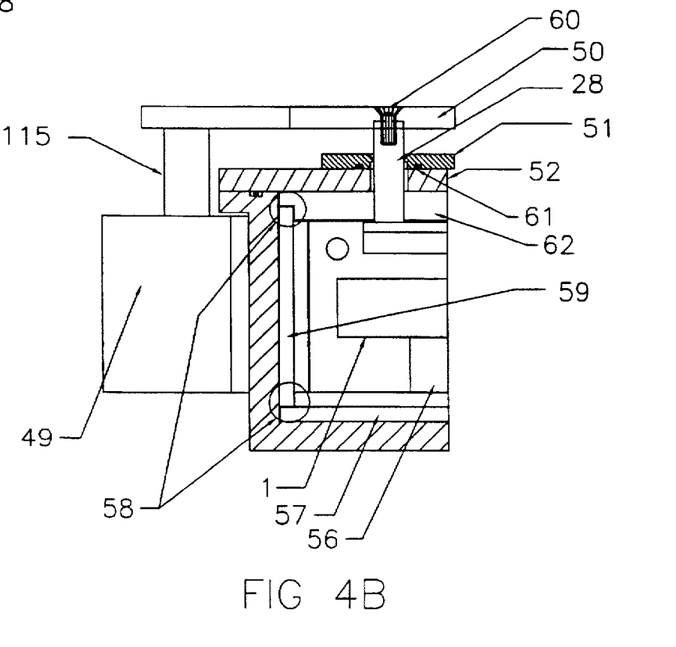
FIG. 4B is an enlarged partial cutaway of the left hand side of the front of the oven with the door assembly removed. It illustrates the arrangement of the heater block with its underlying support, the frame, the insulation, the housing cover, the spacer rod, the sealing plate and the substrate raising plate.

FIG. 4B is an enlarged partial cutaway of the left hand side of the front of the hot plate oven 70 with the door assembly removed. All the parts are as described earlier in connection with FIG. 3B. FIG. 4B shows the overlapping joints 58 of the insulation 57, 59, and 62, and the relationship between the seal 61 within the seal plate 51. One material suitable for the insulation is any ceramic insulation used in hot plate ovens capable of withstanding damage under high temperatures such as 250 degrees Centigrade.

Figure 5:
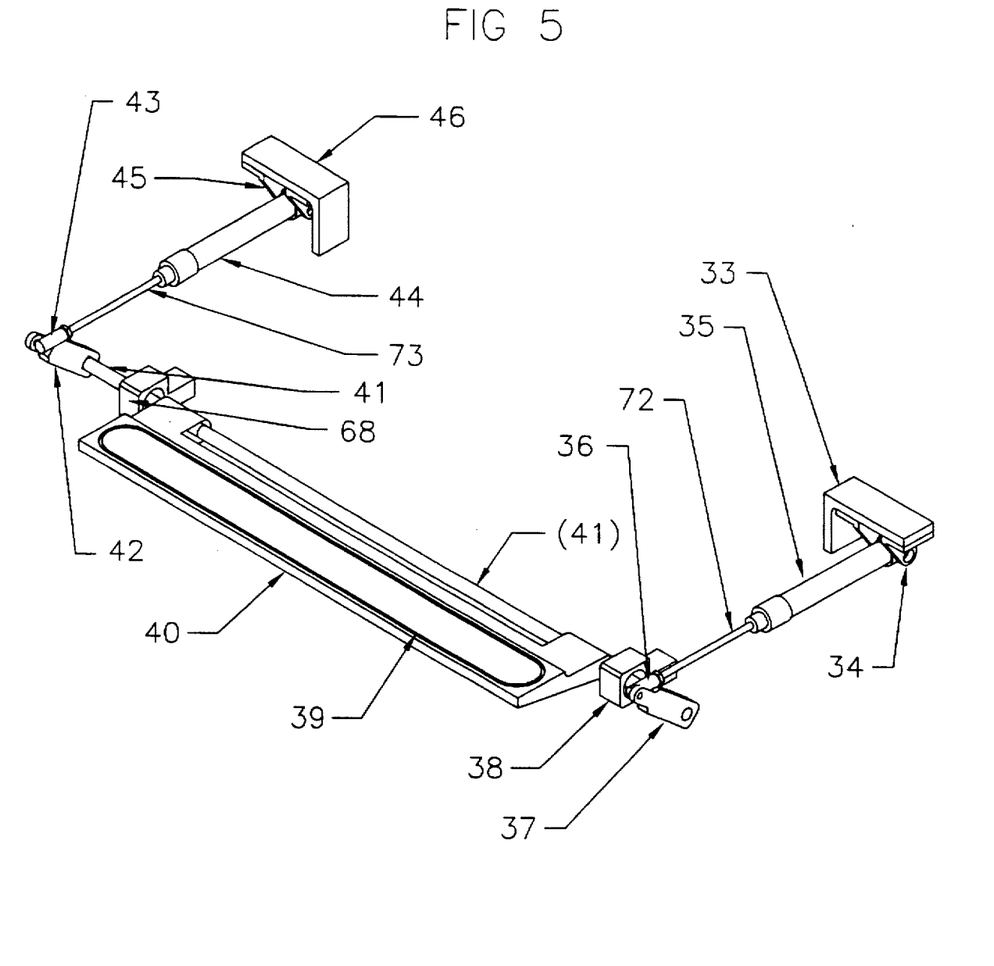
FIG. 5 illustrates an isolated view of the door assembly with the door in the open position.

FIG. 5 illustrates the door assembly with the door in the open position. FIG. 5 shows the isometric view of the oven door and its operating mechanism alone. The components of the door assembly were described earlier in connection with FIG. 3A, and can be made of aluminum with the exception of the shaft 41 and the piston rods 72 and 73 which are preferably made of 300 series stainless steel.

Figure 6:
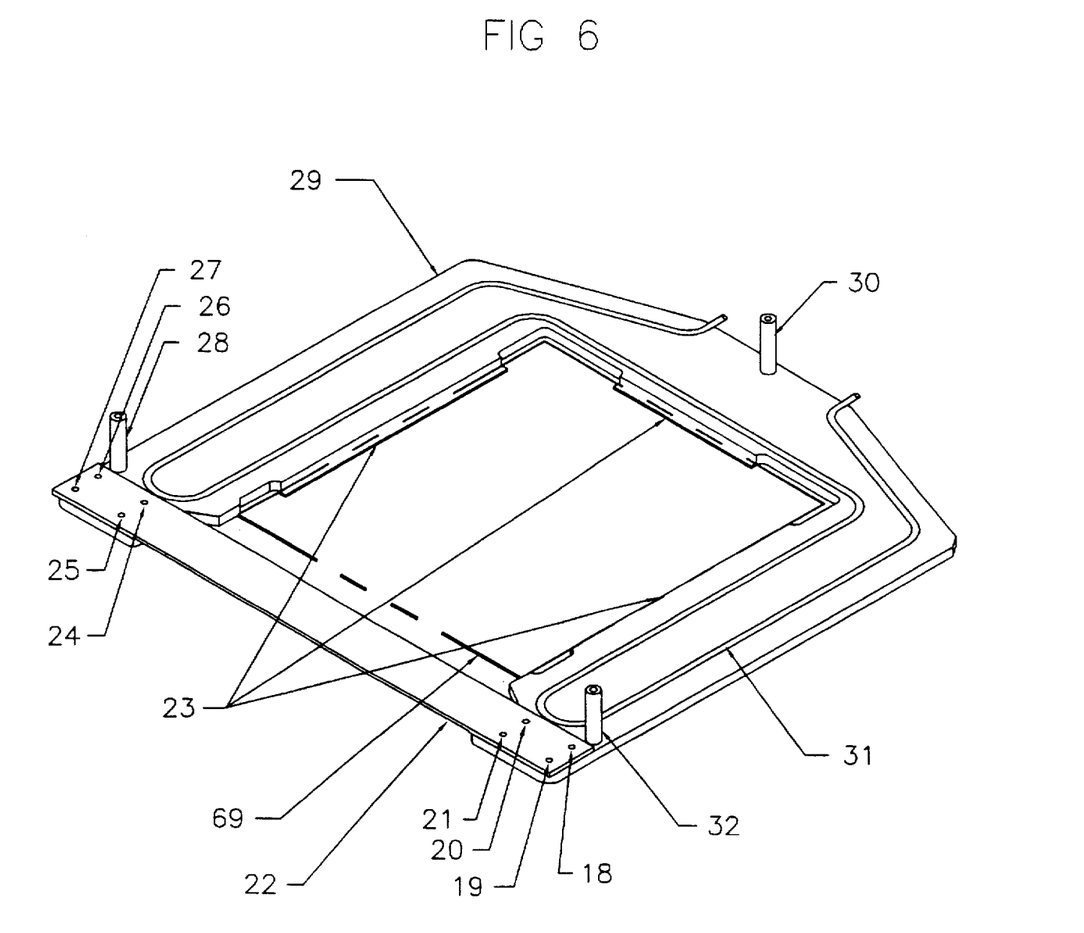
FIG. 6 illustrates the display holding frame by itself for holding a substrate.

FIG. 6 illustrates the display holding frame 29 of preferably a series 300 stainless steel by itself for clarity. During the baking operation, the substrate 69 is supported on its edges by the projections 23 extending along the bottom side of the display holding frame 29. The spacer rods 28, 30 and 32 are press-fit into the display holding frame 29. A cooling tube 31 also of preferably stainless steel is attached by welding to the display holding frame 29 to provide water or nitrogen cooling for the display holding frame 29. The stiffener plate 22 connects the two front sides of the frame 29 by means of the screws 24–27 and 18–21, and has adequate clearance to allow the robotic end effector 67 (FIG. 1) to place the substrate 69 on the frame 29.

Figure 7:
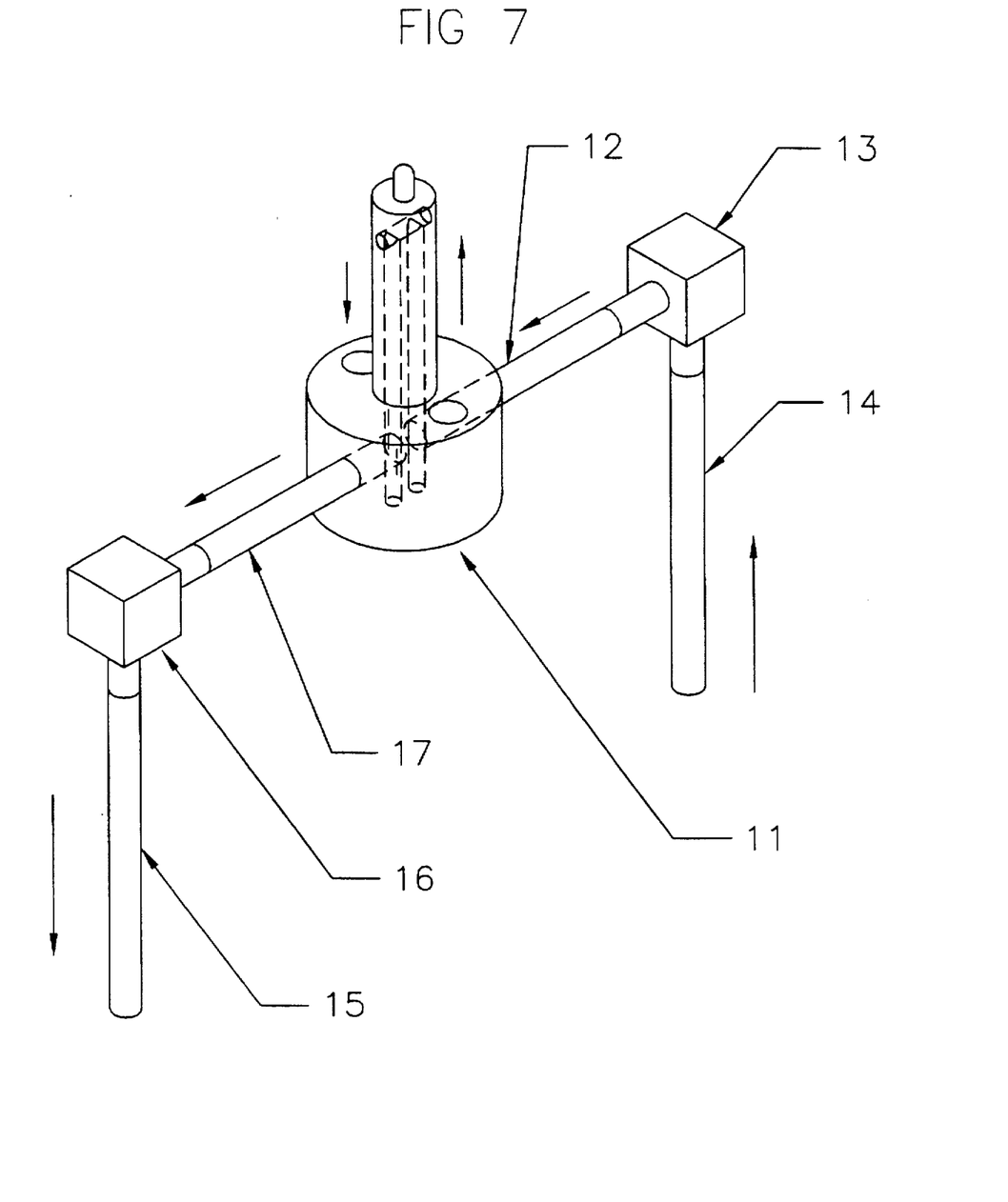
FIG. 7 is an isometric view of the fluid cooled central pin with its associated cooling tubes.

FIG. 7 is an isometric view of the fluid cooled central pin 11. The central pin 11 has machined in holes for passage of cooling fluid so that the fluid enters travels in a circuit from the bottom to top of the central pin 11 and back to cool the tip of the central pin 11. In one embodiment, the central pin 11 can be water or nitrogen cooled to maintain the tip of the central pin 11 at around the room temperature. Thus, thermal shock can be reduced to a minimum when the substrate 69 comes in contact with the central pin 11. The cooling fluid enters first through the cooling tube 14, then the fitting 13, then the cooling tube 17, then into the central pin 11, then the tube 17, then the fitting 16, and finally through the tube 15. The fluid flow rate and type of fluid can be obviously adjusted to accommodate the process temperature requirements.

What is claimed:

1. A method of baking coating materials on a substrate, comprising: opening the door of an oven chamber with a heater to provide access to a wafer handler;

placing a coated substrate on a display holding frame in the oven chamber with the wafer handler;

holding the coated substrate on the display holding frame along the edges of the coated substrate;

closing the door of the oven chamber;

lowering the display holding frame very close to the heater for uniform heating of the coated substrate;

heating the coated substrate;

counteracting any sag of the coated substrate by a fluid cooled central pin which is higher than the top surface of the heater and disposed in a central region of the heater;

maintaining the temperature of the heater at a predetermined level; and removing the coated substrate from the oven chamber after heating the coated substrate for a predetermined time.

* * * * *

UNITED STATES PATENT AND TRADEMARK OFFICE
CERTIFICATE OF CORRECTION

PATENT NO. : 5,756,157
DATED : May 26, 1998
INVENTOR(S) : Chak D. Kannan and Adam Jerome Weber It is certified that error appears in the above-identified patent and that said Letters Patent is hereby corrected as shown below:

Column 1,
Line 3, please insert the following statements:
-- This invention was made with Government support under Agreement No. MDA972-93-2-0014 awarded by ARPA. The Government has certain rights in the invention. --

Signed and Sealed this

Twenty-eighth Day of May, 2002

Attest:

Attesting Officer

JAMES E. ROGAN
Director of the United States Patent and Trademark Office